(12) United States Patent
Wang et al.

(10) Patent No.: US 10,868,185 B2
(45) Date of Patent: Dec. 15, 2020

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Chin-Shan Wang, Hsinchu (TW); Yi-Miaw Lin, Taipei County (TW); Ming-Yih Wang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/201,238

(22) Filed: Nov. 27, 2018

(65) Prior Publication Data

US 2020/0168729 A1   May 28, 2020

(51) Int. Cl.
*H01L 29/78*   (2006.01)
*H01L 29/417*   (2006.01)
*H01L 29/49*   (2006.01)
*H01L 29/423*   (2006.01)
*H01L 29/66*   (2006.01)

(52) U.S. Cl.
CPC ...... *H01L 29/785* (2013.01); *H01L 29/41791* (2013.01); *H01L 29/42372* (2013.01); *H01L 29/49* (2013.01); *H01L 29/66795* (2013.01)

(58) Field of Classification Search
CPC ............. H01L 29/785; H01L 29/41791; H01L 29/42372; H01L 29/49; H01L 29/66795
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,385,207 B2* | 7/2016 | Jagannathan | ..... H01L 21/28211 |
| 9,412,935 B1* | 8/2016 | Lin | ......................... H01L 43/12 |
| 9,484,267 B1* | 11/2016 | Cheng | ............. H01L 21/823821 |
| 9,520,482 B1 | 12/2016 | Chang et al. | |
| 9,576,814 B2 | 2/2017 | Wu et al. | |
| 10,256,247 B1* | 4/2019 | Kanakamedala | ... H01L 29/7926 |

(Continued)

*Primary Examiner* — Nathan W Ha
(74) *Attorney, Agent, or Firm* — WPAT, P.C., Intellectual Property Attorneys; Anthony King

(57) ABSTRACT

The present disclosure provides a semiconductor structure. The semiconductor structure includes a semiconductive substrate, and a first contact plug formed on the semiconductive substrate. The semiconductor structure further includes a dielectric layer encircling the first contact plug. The semiconductor structure further includes a multilayer structure deposited on the dielectric layer and encircling the first contact plug. The dielectric layer produces a tensile stress pulling the first contact plug outward along a width direction. The multilayer structure produces a compressive stress that compensates for the tensile stress caused by the dielectric layer. A method of forming the semiconductor structure is also provided.

20 Claims, 19 Drawing Sheets

(56) References Cited

U.S. PATENT DOCUMENTS

| | | | |
|---|---|---|---|
| 2008/0076244 A1* | 3/2008 | Ye | H01L 21/31144 438/597 |
| 2010/0304542 A1* | 12/2010 | Beyer | H01L 21/28079 438/299 |
| 2011/0280077 A1* | 11/2011 | Fishburn | G11C 16/0408 365/185.18 |
| 2016/0020370 A1* | 1/2016 | Cai | H01L 33/60 257/88 |
| 2016/0056050 A1* | 2/2016 | Kong | H01L 21/31116 438/723 |
| 2016/0104645 A1* | 4/2016 | Hung | H01L 21/823437 257/401 |
| 2016/0133727 A1* | 5/2016 | Hashemi | H01L 29/66795 257/288 |
| 2018/0059858 A1* | 3/2018 | Tsai | G06F 3/0412 |
| 2018/0061848 A1* | 3/2018 | Chen | H01L 27/11529 |
| 2018/0252027 A1* | 9/2018 | Ding | G02B 1/14 |
| 2019/0067186 A1* | 2/2019 | Freeman | H01L 21/76877 |
| 2019/0164813 A1* | 5/2019 | Wang | H01L 21/823468 |
| 2019/0198333 A1* | 6/2019 | Tokashiki | H01L 21/3086 |
| 2019/0206994 A1* | 7/2019 | Huang | H01L 21/30612 |
| 2019/0206998 A1* | 7/2019 | Huang | H01L 29/2003 |
| 2019/0267284 A1* | 8/2019 | Lee | H01L 23/53238 |
| 2019/0326300 A1* | 10/2019 | Liaw | H01L 27/0924 |

* cited by examiner

SEMICONDUCTOR STRUCTURE AND METHOD OF FORMING THE SAME

BACKGROUND

As the semiconductor industry has progressed into nanometer technology process nodes in pursuit of greater device density, higher performance, and lower costs, challenges of both fabrication and design issues have led to the development of three-dimensional designs, such as Fin Field-Effect Transistors (FinFETs). A typical FinFET is fabricated with a thin vertical fin (or fin structure) extending from a substrate, wherein the fin is formed by, for example, etching away a portion of a silicon layer of the substrate. The channel of the FinFET is formed in this vertical fin. A gate is provided over (and sometimes wraps around) the fin. Having a gate on both sides of the channel allows gate control of the channel from both sides. In addition, utilizing selectively grown silicon germanium (SiGe) in strained materials of source/drain (S/D) portions of the FinFET may enhance carrier mobility.

However, there are challenges to implementation of such features and processes in FinFET fabrication. For example, with the rising trend of downsizing of integrated circuits, the fin structures become narrower and, as a result, spaces between contact plugs become correspondingly smaller. Accordingly, the stress caused by oxides on the contact plugs becomes an increasingly severe problem, and may cause the contact plugs to short.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
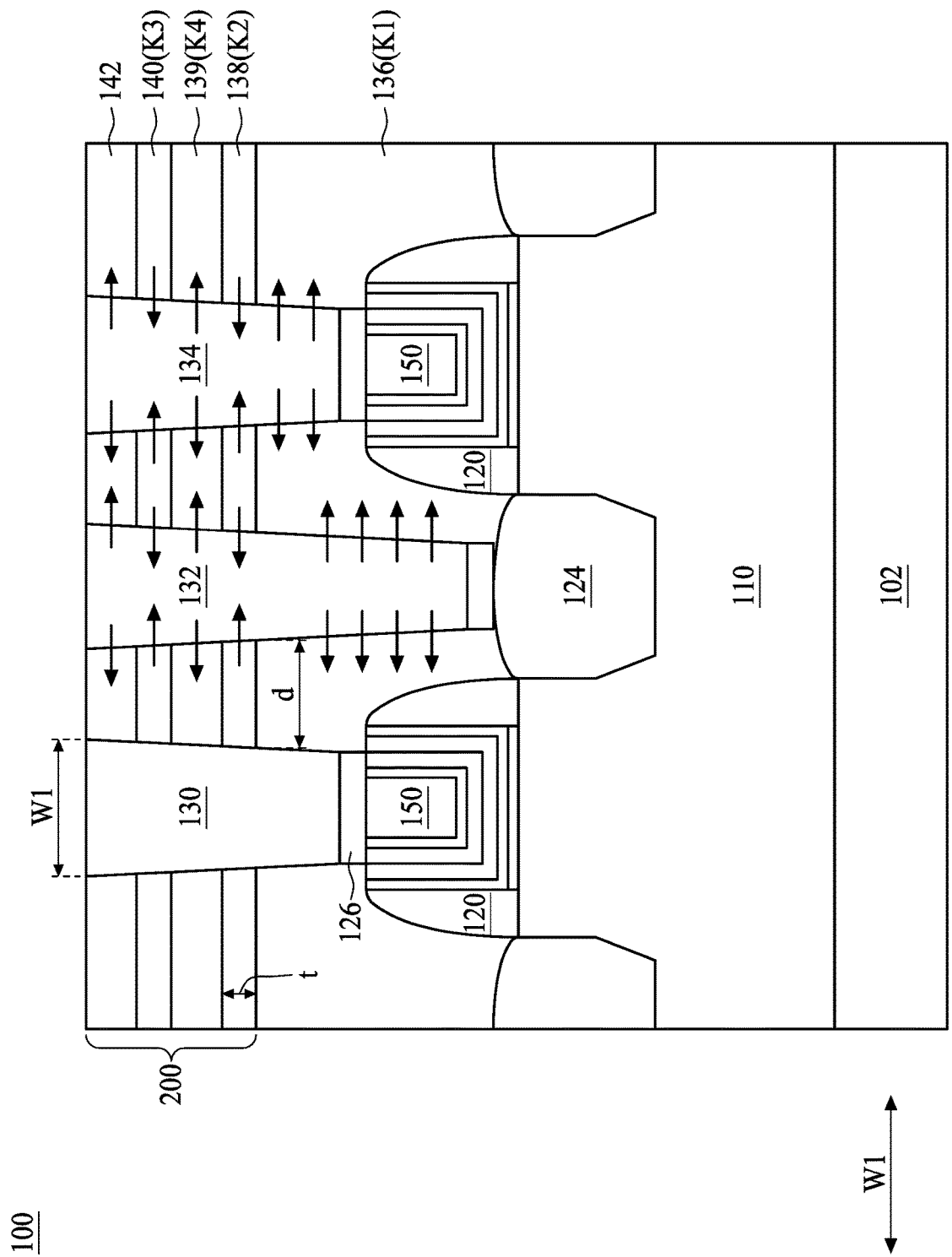
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A Fin Field-Effect Transistor (FinFET) and the method of forming the same are provided in accordance with embodiments. The intermediate stages of manufacturing various embodiments are illustrated. The variations of the embodiments are discussed. Throughout the various views and illustrative embodiments, like reference numbers are used to designate like elements.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than those obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring to FIG. 1, FIG. 1 is a cross section of a semiconductor structure 100 in accordance with some embodiments of the present disclosure. The semiconductor structure 100 includes a semiconductive substrate 102 and a dielectric layer 136 formed over the semiconductive substrate 102. In some embodiments, the semiconductor structure 100 further includes a multilayer structure 200 over the dielectric layer 136.

In some embodiments, the semiconductor structure 100 further includes contact plugs 130, 132 and 134 on the semiconductive substrate 102. The contact plugs 130, 132 and 134 are encircled by the dielectric layer 136 and the multilayer structure 200. It should be noted that the quantity and arrangement of the contact plugs are illustrated merely as examples for explanation, and the present disclosure is not limited thereto.

In some embodiments, the dielectric layer 136 produces a tensile stress pulling each of the contact plugs 130, 132 and 134 outwardly along a width direction W1, as indicated by the arrows on the contact plugs 132 and 134, which point toward the dielectric layer 136. In some embodiments, the dielectric layer 136 produces a tensile stress pulling the contact plugs 130, 132 and 134 toward each other.

To reduce the RC delay, low-k dielectrics are usually used as intermetal dielectrics (IMDs) and interlayer dielectrics (ILDs). The low-k dielectrics preferably have a dielectric constant less than about 3.5, and more preferably less than about 2.5. Besides, the low-k dielectrics tend to soak up liquids because they are softer and more porous than higher-k dielectrics.

The tensile stress produced by the low-k dielectrics may pull the contact plugs toward each other and cause the contact plugs to short, especially when the contact plugs have large areas in contact with the low-k dielectrics. Therefore, the present disclosure provides the semiconductor structure 100 that includes the multilayer structure 200. The multilayer structure 200 produces a compressive stress that compensates for the tensile stress caused by the dielectric layer 136. The compressive stress is illustrated in FIG. 1 with the arrows that point away from the dielectric layer 136 and toward the contact plugs 132 and 134.

In some embodiments, the multilayer structure 200 is in contact with the contact plugs 130, 132 and 134. In some embodiments, the multilayer structure 200 includes a first capping layer 138. In some embodiments, the multilayer structure 200 includes a second capping layer 140 separated from the first capping layer 138 by a dielectric film 139. In some embodiments, the second capping layer 140 is parallel to the first capping layer 138.

In some embodiments, the density of the first capping layer 138 is higher than the density of the dielectric layer 136. In some embodiments, the structure rigidity of the first capping layer 138 is higher than the structure rigidity of the dielectric layer 136. In some embodiments, the dielectric layer 136 has a first dielectric constant (K1). In some embodiments, the first capping layer 138 has a second dielectric constant (K2) higher than the first dielectric constant (K1) of the dielectric layer 136. In some embodiments, the second capping layer 140 has a third dielectric constant (K3) higher than the dielectric constant (K1) of the dielectric layer 136.

In some embodiments, the multilayer structure 200 includes alternating oxide layers and nitride layers. In some embodiments, the multilayer structure 200 includes alternating layers of higher and lower dielectric constants. It should be noted that the terms "higher dielectric constant" and "lower dielectric constant" used here do not refer to higher or lower than specific dielectric constants, but rather refer to dielectric constants that are higher or lower with respect to each other. For example, the dielectric film 139 has a fourth dielectric constant (K4) lower than the second dielectric constant (K2) and the third dielectric constant (K3). In another example, the additional layer 142 over the second capping layer 140 has a dielectric constant lower than the third dielectric constant (K3).

In some embodiments, the capping layers, such as the first capping layer 138 and the second capping layer 140, are interposed into a bulk of the dielectric layer 136. In some embodiments, the multilayer structure 200 may be formed by interposing one or more capping layers with higher dielectric constant into a bulk of a low-k dielectric.

Although two capping layers are illustrated in the figures of the present disclosure for simplicity of explanation, the numbers and arrangements of the capping layers are illustrated merely as examples for explanation, and can be adjusted or modified for meeting other requirements in accordance with the spirit of the present invention, such as reducing stress exerted by the dielectric layer 136.

In some embodiments, the multilayer structure 200 may be formed according to some critical dimensions of the contact plugs 130, 132 and 134. For example, the critical dimensions include width (w) of one of the contact plugs 130, 132 and 134. In some embodiments, the contact plug 130 is a gate electrode on the semiconductive substrate 102, and the gate electrode 130 has a width (w) of about 20 nm to 26 nm. In some embodiments, the width (w) is not greater than 24 nm. In addition, the critical dimensions may include a distance (d) between two of the contact plugs 130, 132 and 134. In some embodiments, a distance (d) therebetween is as small as possible, as long as the contact plugs 130, 132 and 134 do not short with each other. The multilayer structure 200, in contact with and between the contact plugs 130, 132 and 134, also keeps the contact plugs 130, 132 and 134 separate from each other.

In some embodiments, the multilayer structure 200 may be adjusted in various ways, such as thickness (t), materials and numbers of layers in the multilayer structure. In addition, a distance between two capping layers may be adjusted.

Still referring to FIG. 1, in some embodiments, the semiconductor structure 100 further includes a fin structure (hereinafter referred to as a "fin") 110 formed over the semiconductive substrate 102. In some embodiments, the semiconductor structure 100 further includes gate stacks 150 and source/drain regions 124 between the fin 110 and the contact plugs 130, 132 and 134. In some embodiments, the contact plugs 130 and 134 are connected to the gate stack 150, wherein the contact plugs are also referred to as gate electrodes 130 and 134. In some embodiments, the contact plug 132 is connected to the source/drain regions 124.

Figure 2:
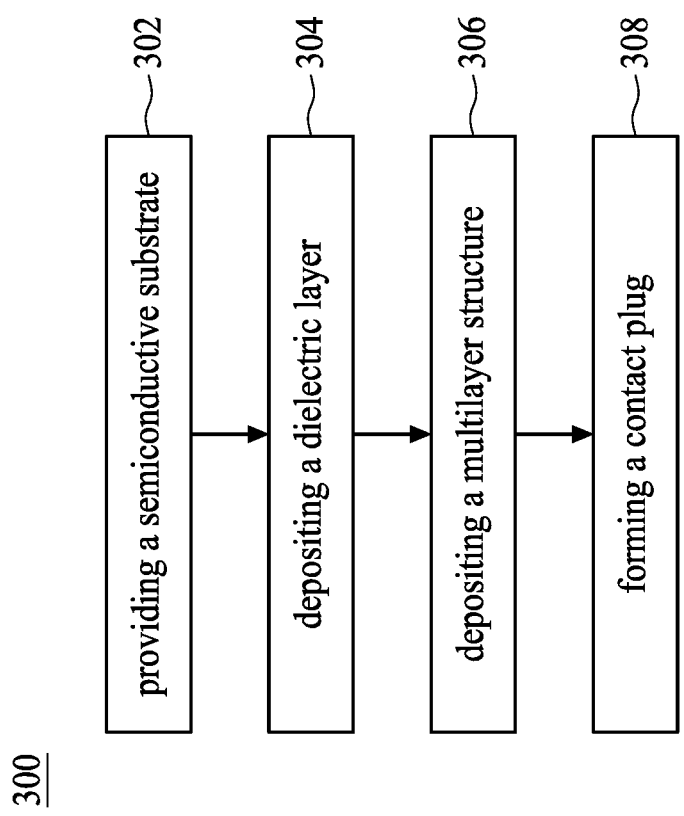
FIG. 2 is a flowchart of a method of forming a semiconductor structure, in accordance with some embodiments of the present disclosure.

FIG. 2 is a flowchart of a method 300 of forming a semiconductor structure in accordance with some embodiments of the present disclosure. The method 300 is described herein with reference to FIGS. 3 to 12; the identical numbers represent similar components for simplicity of explanation.

The method 300 includes operation 302, providing a semiconductive substrate, which will be described with reference to FIGS. 3 to 6B. The method 300 further includes operation 304, depositing a dielectric layer, which will be described with reference to FIG. 7. The method 300 further includes operation 306, depositing a multilayer structure, which will be described with reference to FIG. 9. The method 300 further includes operation 308, forming a contact plug, which will be described with reference to FIGS. 10 to 12.

Figure 3:
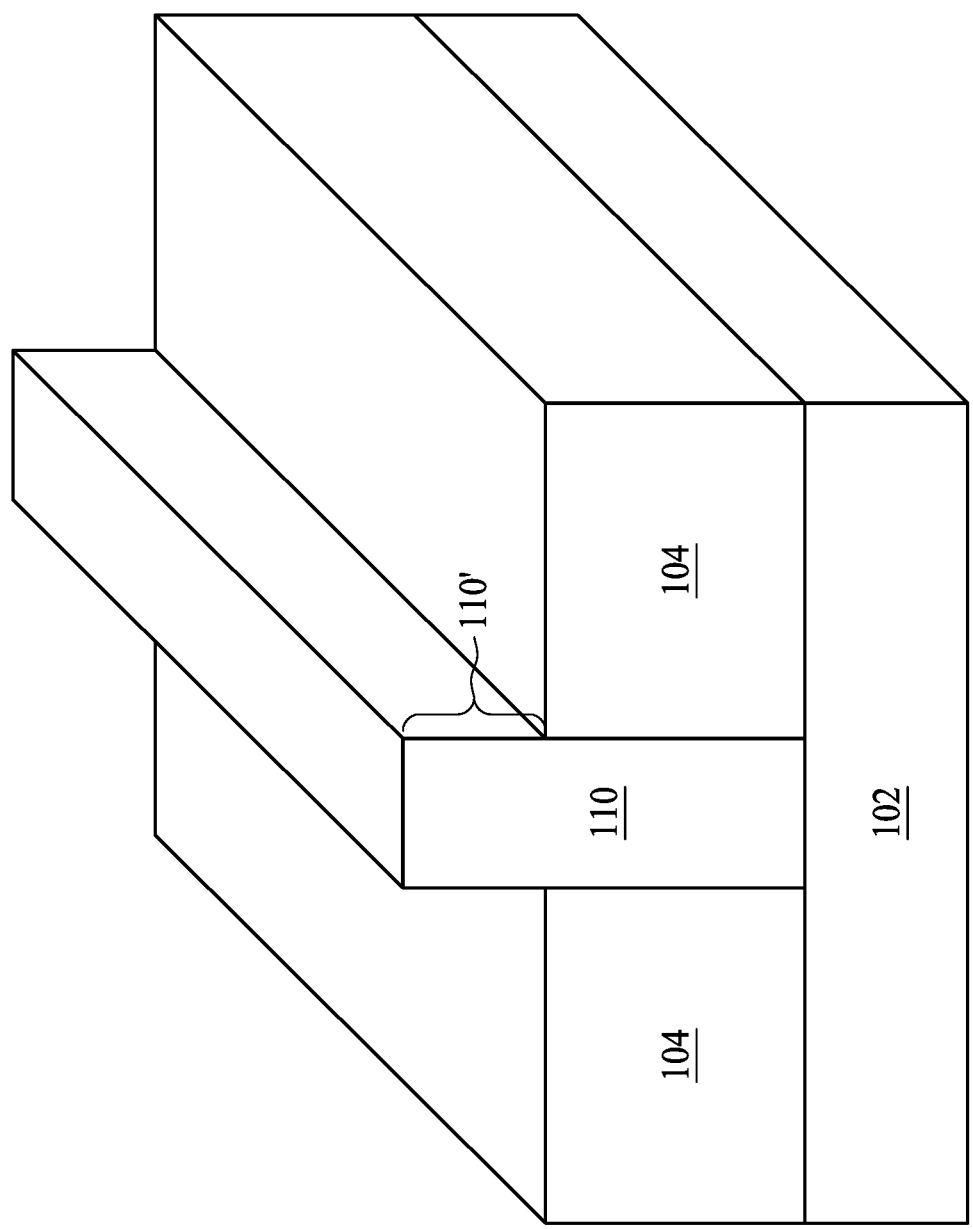
FIGS. 3 to 12 are perspective and cross-sectional views of a semiconductor structure at various stages of fabrication, in accordance with some embodiments of the present disclosure.

The method 300 begins at operation 302, providing a semiconductive substrate. As shown in FIG. 3, the semiconductive substrate 102 with isolation regions 104 is provided as an initial structure. The semiconductive substrate 102 may include a silicon substrate, a silicon germanium substrate, or a substrate formed of other semiconductor materials. In some embodiments, the semiconductive substrate 102 may be doped with a p-type or an n-type impurity.

The isolation regions 104 may also be referred to as Shallow Trench Isolation (STI) regions. The isolation regions 104 may be formed to extend downward from a top surface of the semiconductive substrate 102. The isolation regions 104 may include two neighboring isolation regions having their sidewalls facing each other, with the fin 110 between, and adjoining, the two neighboring isolation regions 104.

In some embodiments, the bottom of the fin 110 may be level with, lower than, or higher than the bottoms of the isolation regions 104. In some embodiments, the semiconductor materials of the fin 110 may be formed by selective epitaxial growth (SEG). In some embodiments, the semiconductor materials of the fin 110 may include a III-V compound semiconductor, such as, but not limited to, GaAs, InP, GaN, InGaAs, InAlAs, GaSb, AlSb, AlAs, AlP, GaP, combinations thereof, and multi-layers thereof. In an exemplary embodiment, the aspect ratio (the ratio of the height to the width) of the fin 110 may be greater than about 1, or even greater than about 5. In some embodiments, the isolation regions 104 are recessed, so that top portions of the fin 110 are higher than the top surfaces of the isolation regions 104, thereby forming fins 110'. The recessing may be performed in a dry etching process, wherein, for example, HF and $NH_3$ are used as the etching gases.

Figure 4A:
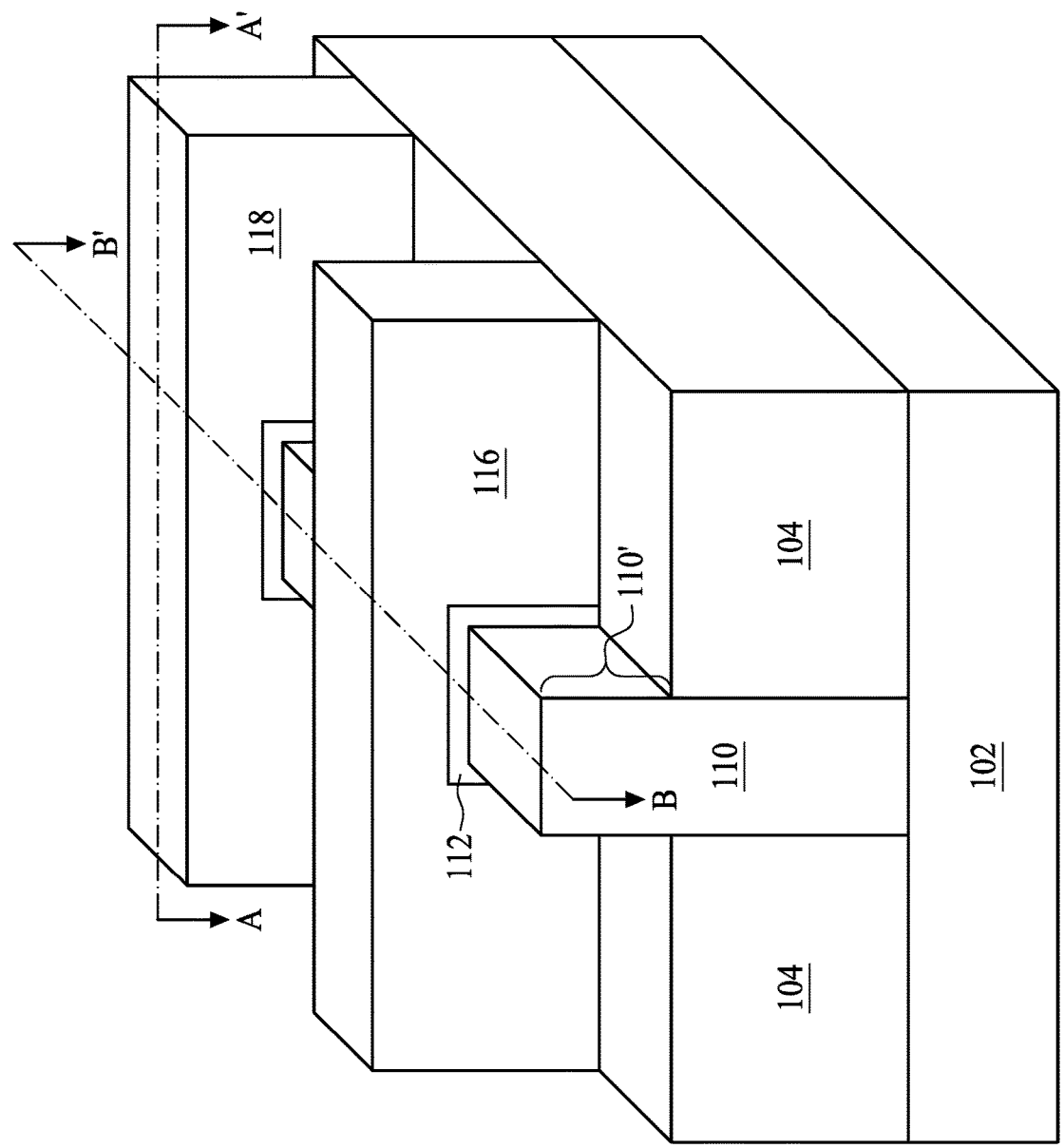
Figure 4C:
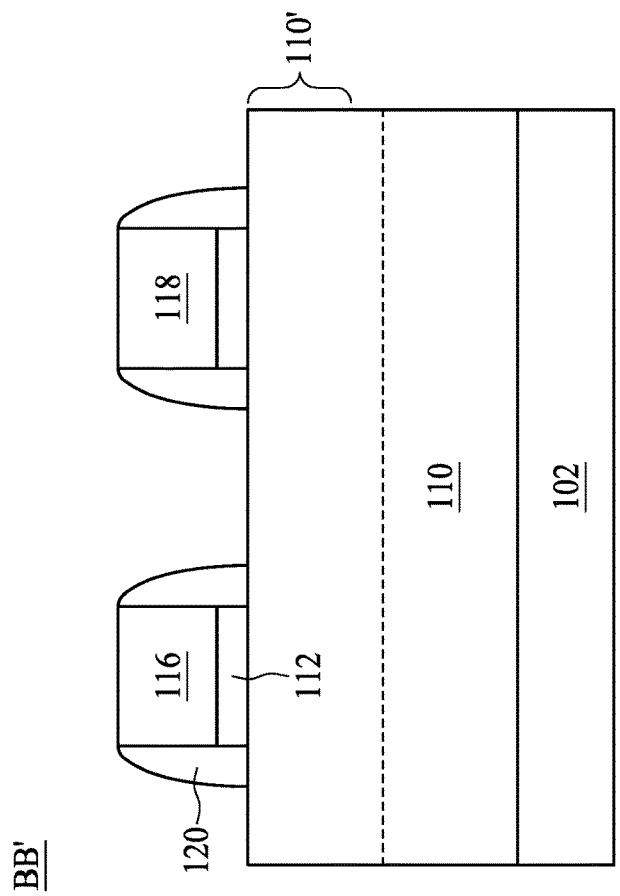
Figure 4B:
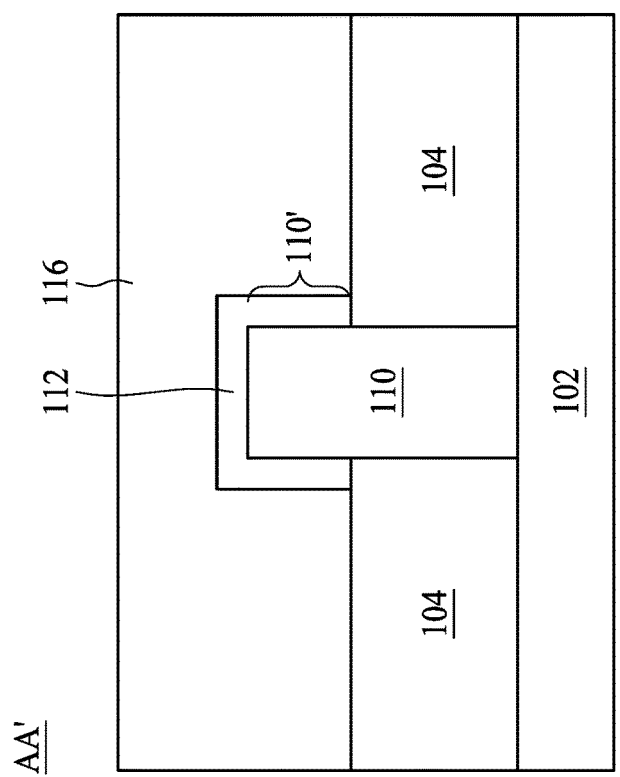

In FIGS. 4A to 4C, a dummy gate dielectric 112 and dummy gate electrodes 116 and 118 are formed on the top surface and side walls of the fin 110. Although there are only one fin 110 and two isolation regions 104 in the figures, the dummy gate electrodes 116 and 118 may cross over a single one or a plurality of fins 110 and/or the isolation regions 104. The dummy gate electrodes 116 and 118 may have a lengthwise direction substantially perpendicular to the lengthwise direction of the fin 110. The dummy gate dielectric 112 and the dummy gate electrodes 116 and 118 are together called a dummy gate stack, and will be replaced by a metal gate stack in a subsequent operation.

In some embodiments, the dummy gate dielectric 112 may include high-k dielectrics, Hf-containing dielectrics, oxynitrides, silicon oxides, and silicon nitrides.

For example, the dummy gate dielectric 112 may include HfZrO, HfZrON, HfLaO, HfSiO, HfSiON, HfTaO, HfTiO, LaO, AlO, ZrO, TiO, $Ta_2O_5$, $Y_2O_3$, $SrTiO_3$, $BaTiO_3$, BaZrO, LaSiO, AlSiO, $TiO_3$, $Al_2O_3$, $Si_3N_4$, or other suitable materials. The dummy gate dielectric 112 may be formed by Atomic Layer Deposition (ALD), Chemical Vapor Deposition (CVD), Physical Vapor Deposition (PVD), thermal oxidation, or combinations thereof. In some embodiments, a barrier layer (not shown) may be formed over the dummy gate dielectric 112 to function as a barrier between the dummy gate dielectric 112 and subsequently-formed dummy gate stacks to reduce or eliminate the risk of Fermi level pinning between the poly and the high-k dielectric during subsequent processing. Further, the barrier layer may also function as a stop layer for an etching operation. The barrier layer may be formed by various deposition techniques such as PVD, CVD, plating, or sputtering.

In some embodiments, the dummy gate electrodes 116 and 118 may include polysilicon. In some embodiments, a hard mask layer (not shown) may be formed over the dummy gate electrodes 116 and 118, wherein the hard mask layer may comprise silicon oxide. FIGS. 4B and 4C are cross-sectional views along lines AA' and BB', respectively, in FIG. 4A in accordance with some embodiments of the present disclosure. FIG. 4C further illustrates gate spacers 120 (not shown in FIGS. 4A and 4B) formed on the sidewalls of the dummy gate stacks. In some embodiments, the gate spacers 120 include silicon carbon nitride, silicon nitride, or the like, and may have a single-layer structure or a multi-layer structure.

Figure 5A:
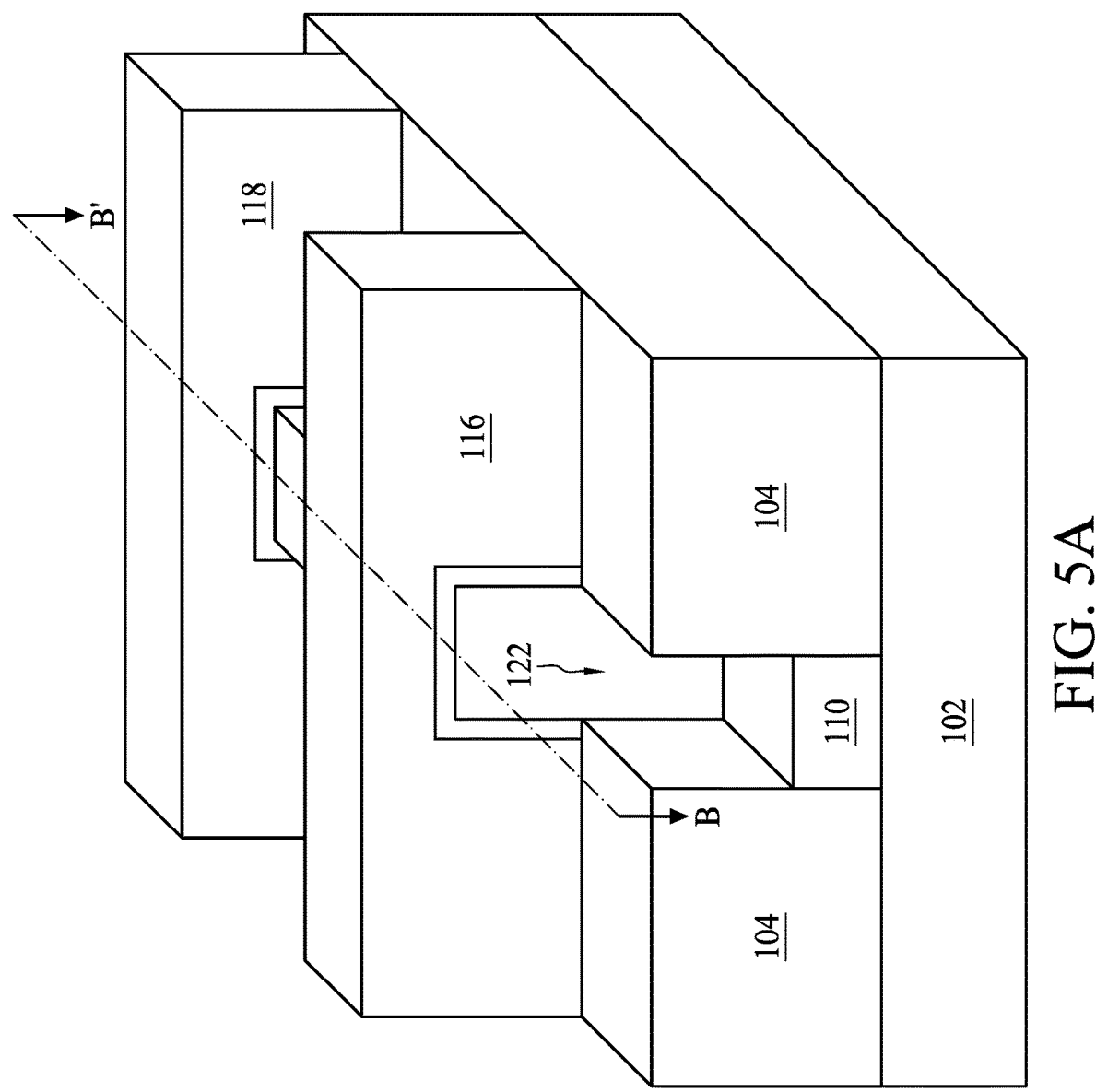
Figure 5B:
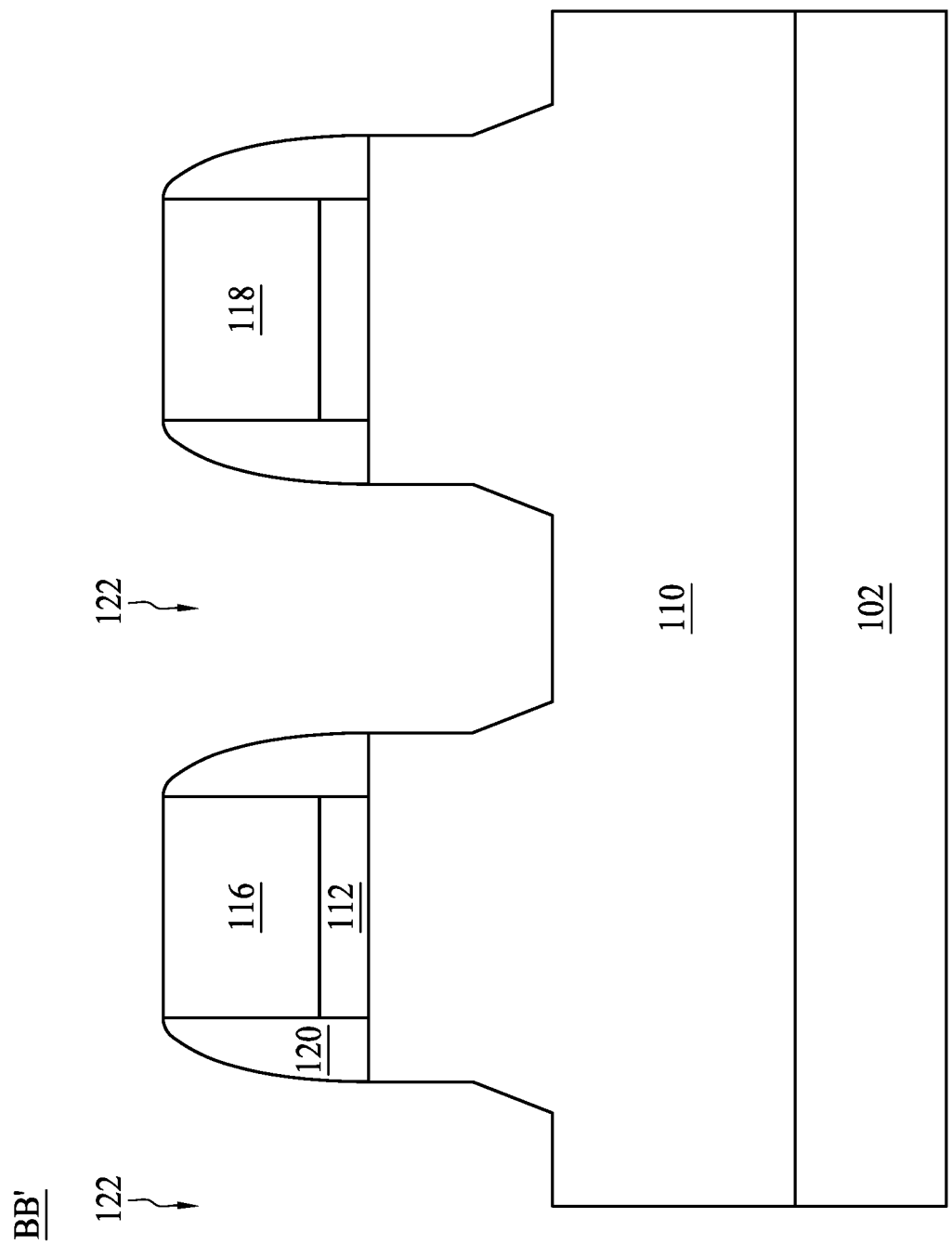

As shown in FIGS. 5A and 5B, an etching operation (also called source/drain recessing) is performed to etch portions of the fin 110 that are not covered by the dummy gate stack or the gate spacers 120, forming recesses 122. The recesses 122 are located on opposite sides of the dummy gate stacks. The etching may be anisotropic, and hence the portions of the fin 110 directly underlying the dummy gate stacks or the gate spacers 120 are protected, and are not etched. In other embodiments, the recesses 122 may extend to directly below gate spacers 120. In some embodiments, the recesses 122 may have bottoms level with, lower than, or higher than the bottom surfaces of the isolation regions 104. In some embodiments, when the recesses 122 reach the bottom surfaces of the isolation regions 104, further recessing will cause the recesses 122 to expand laterally since there are no isolation regions 104 preventing the lateral expansion.

Figure 6A:
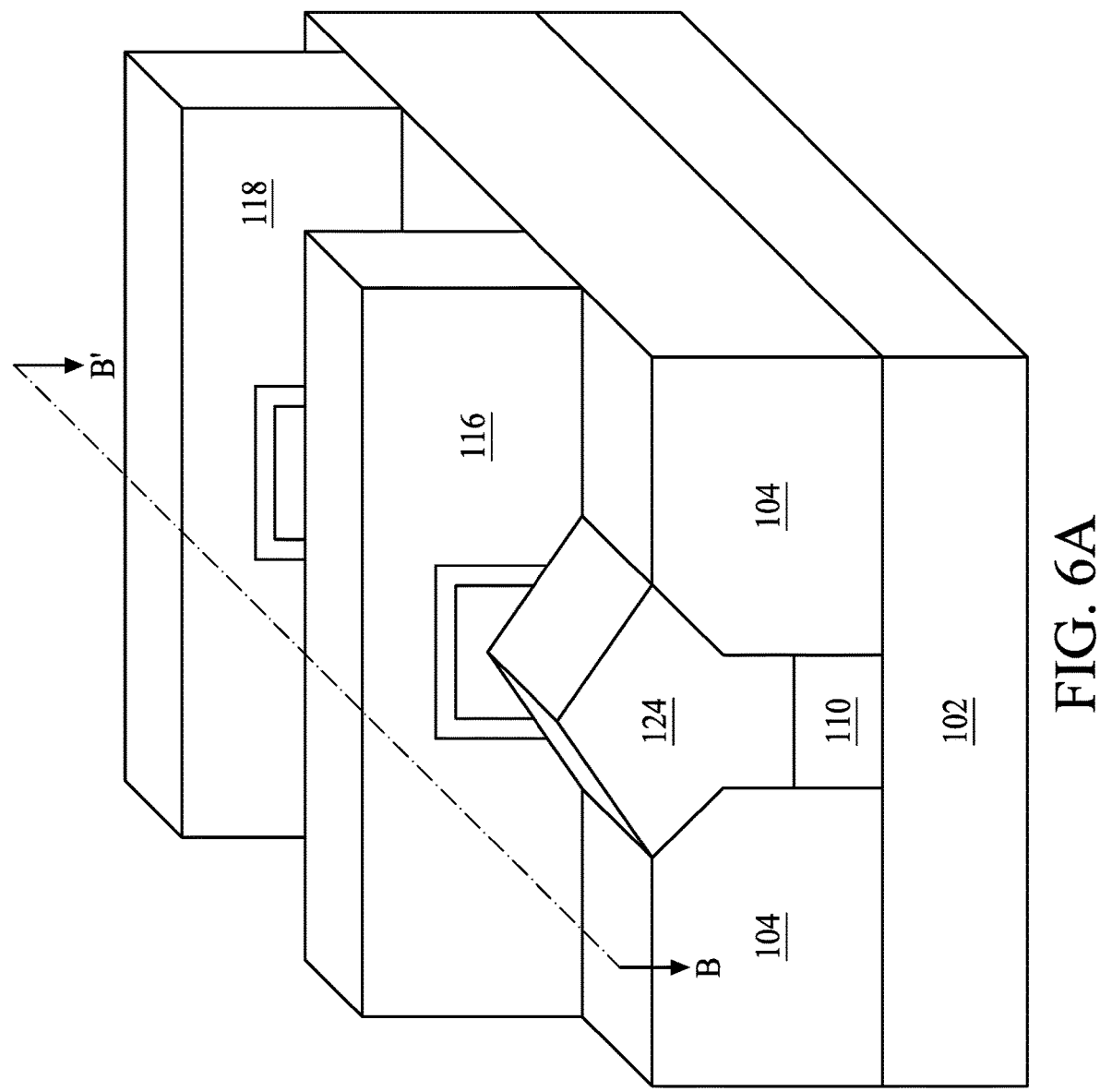
Figure 6B:
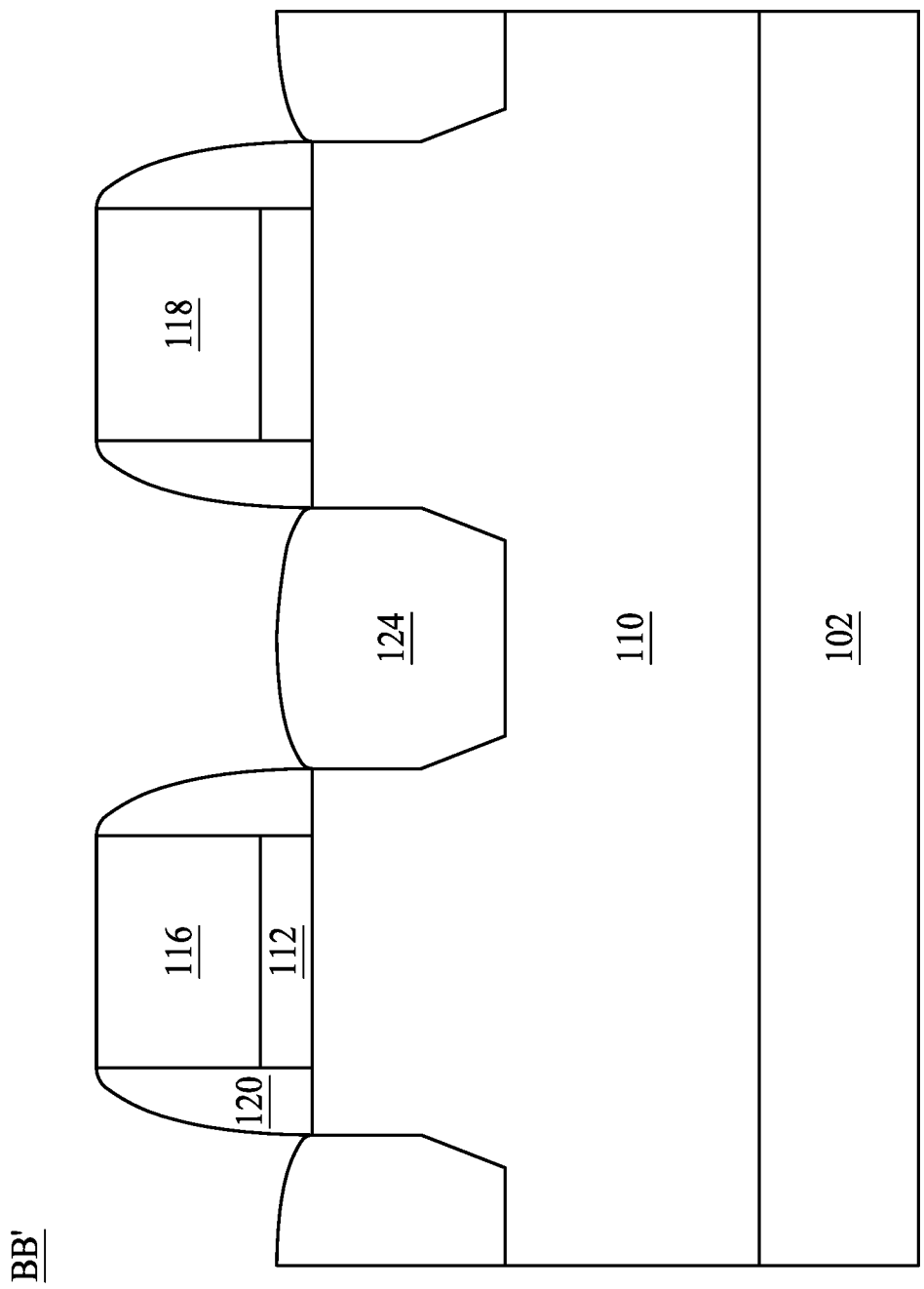

In FIGS. 6A and 6B, the source/drain regions 124 are formed in the recesses 122. In some embodiments, the source/drain regions 124 may be formed by selectively growing a semiconductor material in the recesses 122, or may also be formed through selective epitaxial growth (SEG). In some embodiments, the epitaxy of the source/drain regions 124 is performed using a CVD method such as low-pressure CVD, ultra low-pressure CVD, or the like. In some embodiments, the source/drain regions 124 may include silicon germanium or silicon. Depending on whether the resulting FinFET is p-type or n-type, a p-type or an n-type impurity may be doped. For example, when the resulting FinFET is a p-type FinFET, SiGeB may be grown. Conversely, when the resulting FinFET is an n-type FinFET, SiP may be grown. In alternative embodiments, the source/drain regions 124 comprise III-V compound semiconductors such as GaAs, InP, GaN, InGaAs, InAlAs, GaSb, AlSb, AlAs, AlP, GaP, combinations thereof, or multi-layers thereof. In some embodiments, the impurity may be in-situ doped with the proceeding of the epitaxy.

In some embodiments, after the recesses 122 are filled, the further epitaxial growth causes the source/drain regions 124 to expand horizontally, and facets may start to form. Furthermore, some of top surfaces of the isolation regions 104 are underlying and aligned with portions of the source/drain regions 124 due to the lateral growth of the source/drain regions 124.

Figure 7:
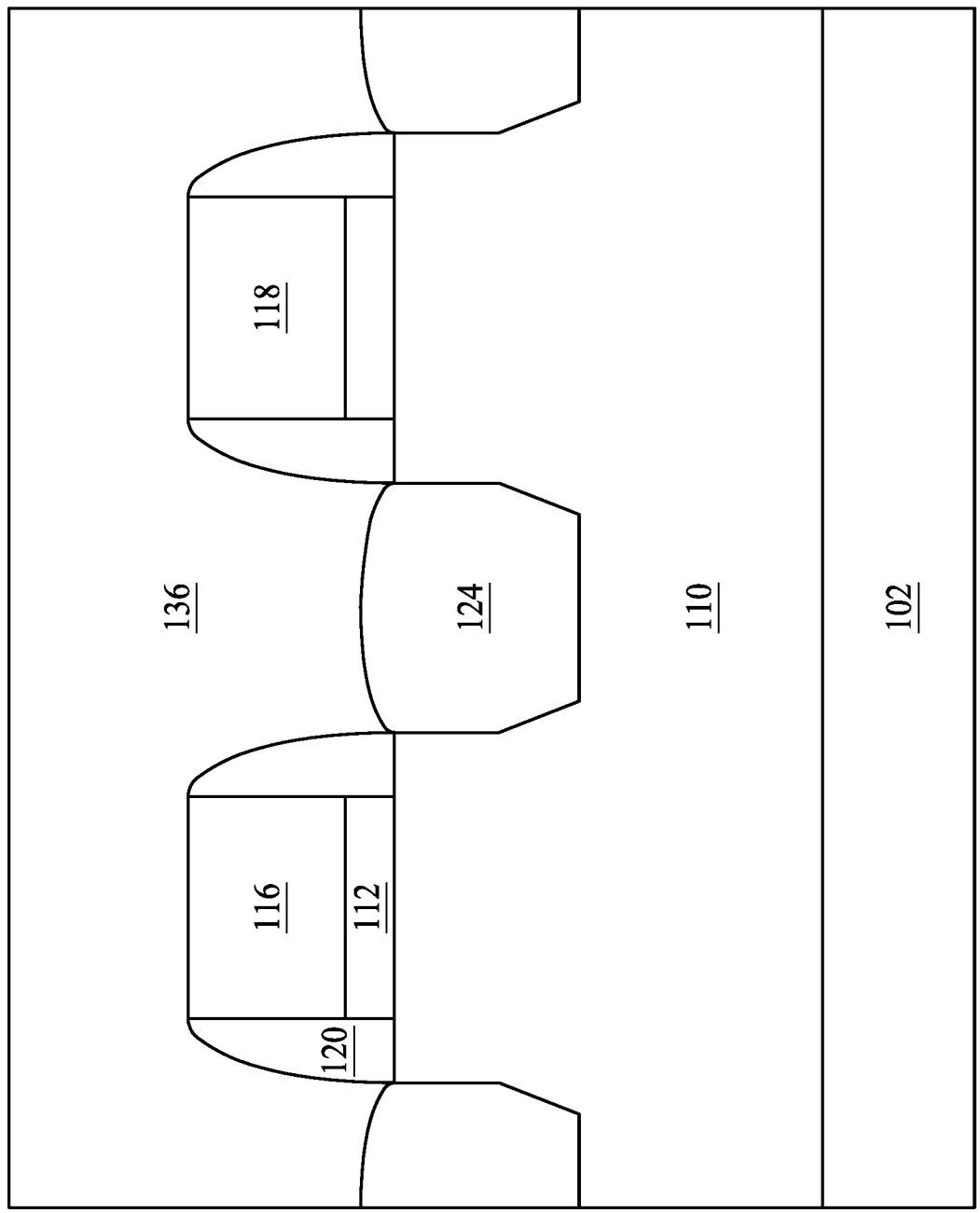

Referring back to FIG. 2, the method 300 proceeds to operation 304, depositing a dielectric layer. As shown in FIG. 7, the dielectric layer 136 is formed. As mentioned above with respect to FIG. 1, low-k dielectrics are usually used to form the dielectric layer 136. In some embodiments, the dielectric layer 136 may include porous materials, such as porous oxides, porous nitrides, porogens, or combinations thereof. In some embodiments, the dielectric layer 136 may include organo silicate glass (OSG), borophosphosilicate glass (BPSG), borosilicate glass (BSG), phosphosilicate glass (PSG), fluorinated silicate glass (FSG), or combinations thereof. In some embodiments, the dielectric layer 136 may also include extreme low-k (ELK) dielectrics, which typically have a dielectric constant less than about 2. Suitable ELK dielectric materials may include spun-on-glass (SOG), plasma enhanced tetraethoxysilane (PETEOS), or halogenated SiO. In some embodiments, the dielectric layer 136 may be formed by various deposition techniques such as PVD, CVD, ALD, sputtering, plating, or coating. In some embodiments, the dielectric layer 136 may be formed by coating an oxide over the source/drain regions 124 and the dummy gate stacks.

In some embodiments, a buffer oxide layer (not shown) and/or a Contact Etch Stop Layer (CESL) may be formed on the source/drain regions 124 before the formation of the dielectric layer 136. In some embodiments, the buffer oxide layer comprises silicon oxide, and the CESL may comprise silicon nitride, silicon oxynitride, or silicon carbonitride.

Figure 8:
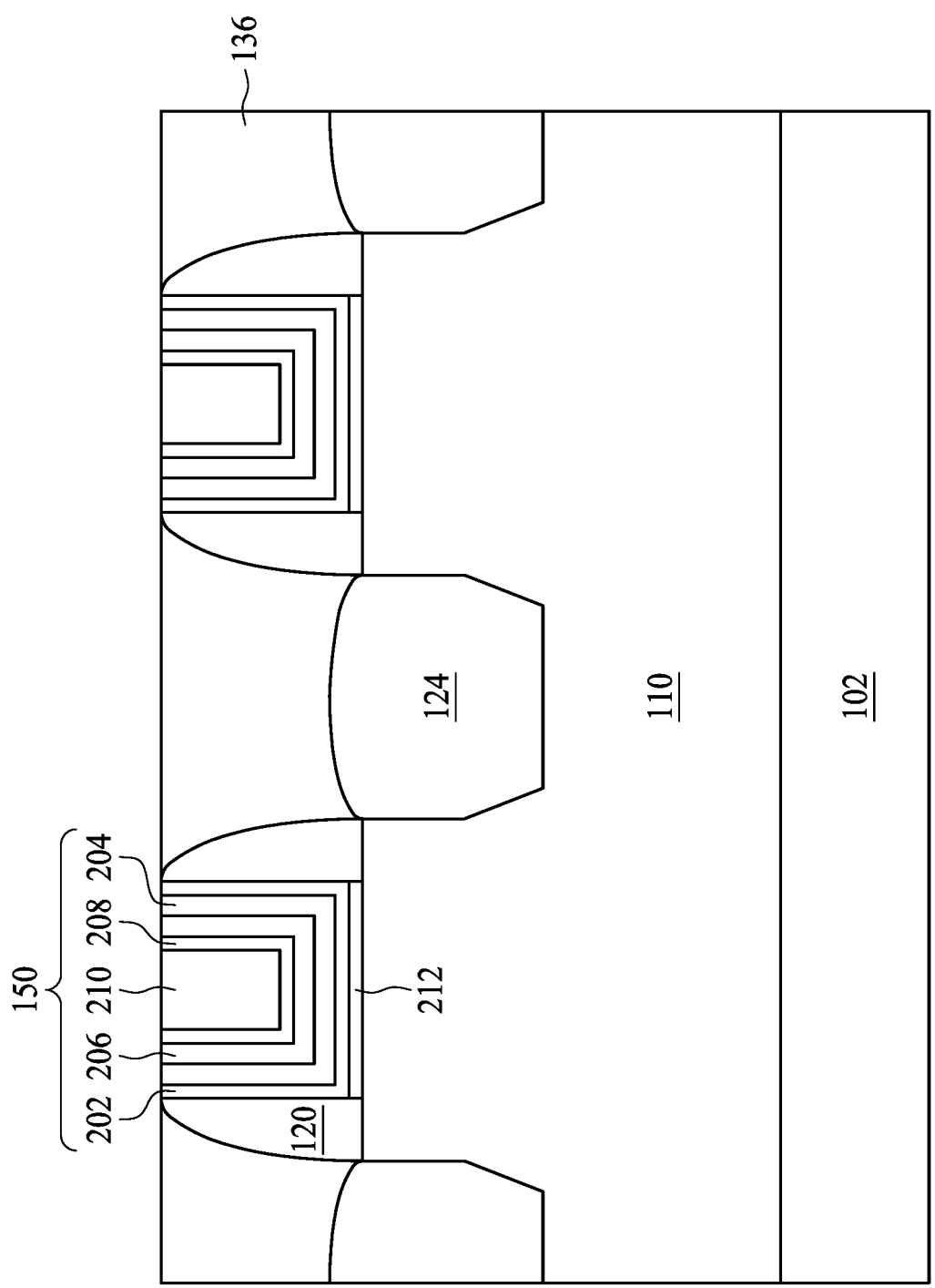

As shown in FIG. 8, the dummy gate stacks are removed and replaced with metal gate stacks 150. In some embodiments, a Chemical Mechanical Polish (CMP) may be performed to make the top surfaces of the dielectric layer 136, the dummy gate stacks, and the gate spacers 120 level with each other. The dummy gate stacks may be removed by etch back process, dry etch, wet etch, or other suitable process. The metal gate stacks 150 may include a plurality of layers, such as interfacial layers, gate dielectric layers, work function layers, capping layers, and/or other suitable layers.

In some embodiments, the metal gate stacks 150 may include a gate dielectric layer 212. The gate dielectric layer 212 may include silicon dioxide. The gate dielectric layer 212 may further include high-k dielectrics such as $HfO_2$, $TiO_2$, HfZrO, $Ta_2O_3$, $HfSiO_4$, $ZrO_2$, $ZrSiO_2$, combinations thereof, or other suitable material. In some embodiments, the metal gate stacks 150 may further include a high-k film 202 lining the internal sidewalls of the gate spacers 120 and the gate dielectric layer 212.

In some embodiments, the metal gate stacks 150 may further include work function layers, such as a p-type work function layer 204 and an n-type work function layer 208. Exemplary p-type work function metals that may be included in the metal gate stacks 150 include TiN, TaN, Ru, Mo, Al, WN, $ZrSi_2$, $MoSi_2$, $TaSi_2$, $NiSi_2$, WN, other suitable materials, or combinations thereof. Exemplary n-type work function metals that may be included in the metal gate stacks 150 include Ti, Ag, TaAl, TaAlC, TiAlN, TaC, TaCN, TaSiN, Mn, Zr, other suitable materials, or combinations thereof. The work function layer may include a plurality of layers. The work function layer(s) may be deposited by CVD, PVD, and/or other suitable process.

In some embodiments, the metal gate stacks 150 may further include an interfacial layer 206. The interfacial layer 206 may include a dielectric material such as silicon oxide ($SiO_2$) or silicon oxynitride (SiON). The interfacial dielectric layer may be formed by chemical oxidation, thermal oxidation, ALD, or CVD.

In some embodiments, the metal gate stacks 150 may further include a fill metal layer 210. The fill metal layer 210 may include Al, W, or Cu, other suitable materials, or combinations thereof. The fill metal layer 210 may be formed by CVD, PVD, plating, and/or other suitable processes. The fill metal layer 210 may be deposited over the work function metal layer(s), thereby filling in the remaining portion of the trenches or openings formed by the removal of the dummy gate stacks. In some embodiments, a silicide layer may interpose the work function layer 208 and the fill metal layer 210.

Figure 9:
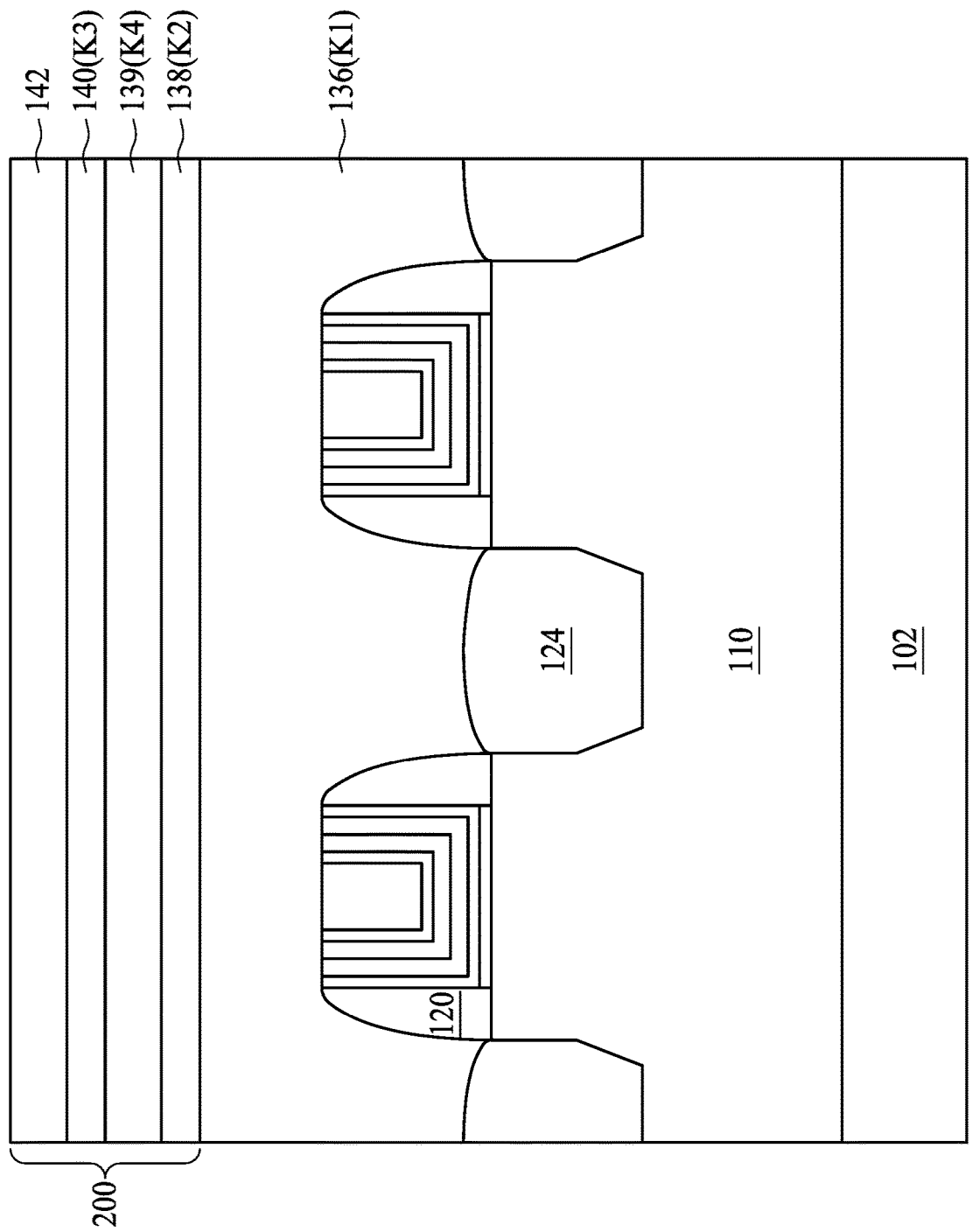

Referring back to FIG. 2, the method 300 proceeds to operation 306, depositing a multilayer structure. As shown in FIG. 9, the multilayer structure 200 is formed on the dielectric layer 136. The detailed descriptions of the structures of the multilayer structure 200 can be found by referring to the descriptions according to FIG. 1.

In some embodiments, the capping layers 138 and 140 may include high-k dielectrics, Hf-containing dielectrics, oxynitrides, silicon oxides, and silicon nitrides. The capping layers 138 and 140 may formed by various deposition techniques capable of depositing high-k dielectrics as mentioned above. The dielectric film 139 between the capping layers 138 and 140 may formed by the same or similar materials and deposition techniques as those used to form the dielectric layer 136.

In some embodiments, as mentioned above with respect to FIG. 1, the multilayer structure 200 may be adjusted according to the critical dimensions of the contact plugs formed in the subsequent operations.

In some embodiments, the method 300 may further include determining a critical dimension for the contact plugs before depositing the multilayer structure 200. For example, in addition to the width (w) of the contact plugs and the distance (d) between the contact plugs, the surface areas of the contact plugs that will be in contact with the dielectric layer 136 may also be taken into consideration.

The materials, thicknesses, numbers, and configurations of the layers in the multilayer structure 200 may be chosen according to the critical dimensions. Furthermore, the dielectric constant of the dielectric layer 136 and the layers in the multilayer structure 200 may also be chosen to adjust the forces on the contact plugs, in order to prevent the contact plugs from short with each other.

Figure 10:
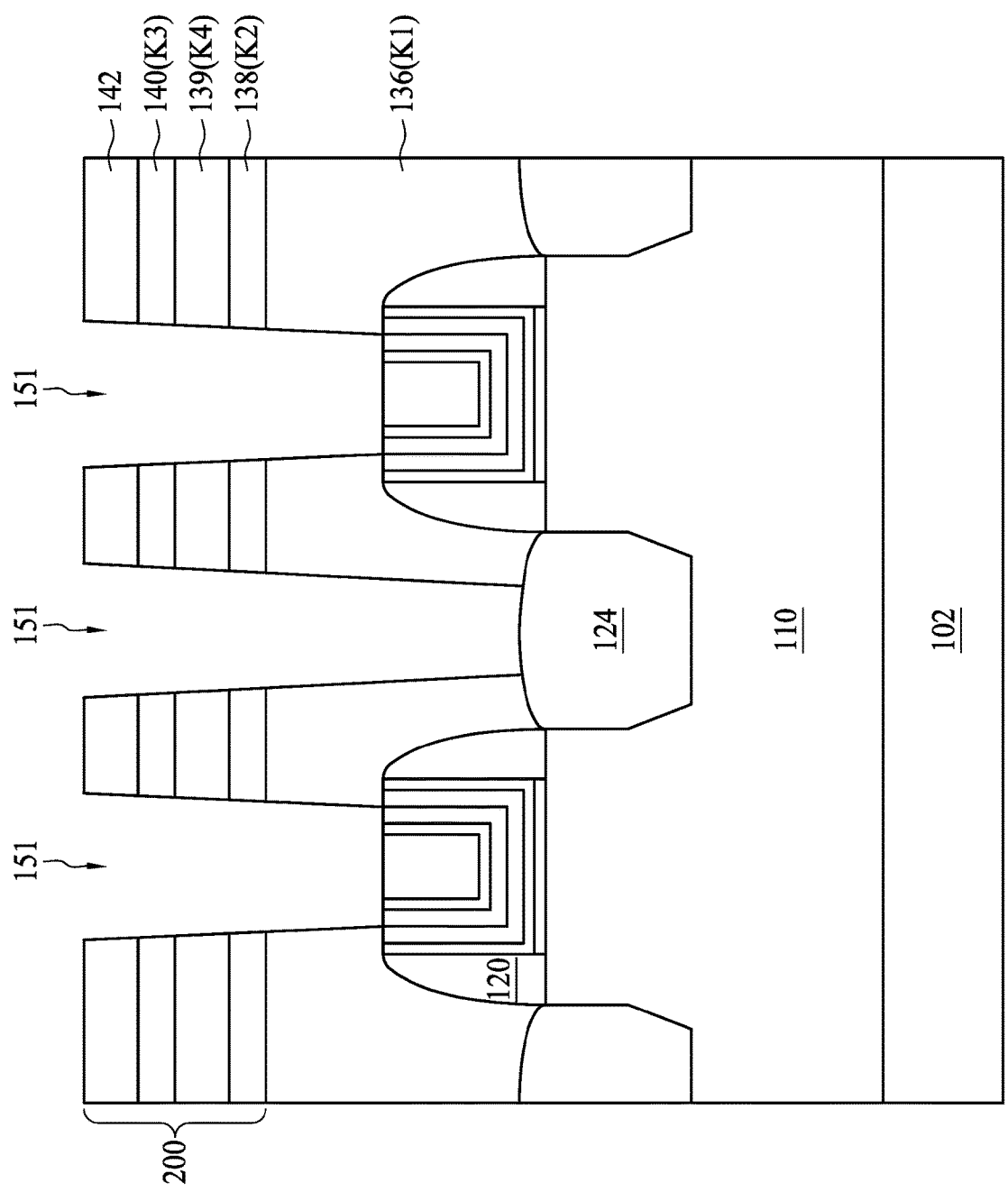

Referring back to FIG. 2, the method 300 proceeds to operation 308, forming a contact plug. As shown in FIG. 10, some portions of the dielectric layer 136 and the multilayer structure 200 are removed, thereby forming openings 151. In some embodiments, some portions of the metal gate stacks 150 and the source/drain region 124 are exposed by the openings 151. In some embodiments, the openings 151 above the metal gate stacks 150 and the opening 151 above the source/drain region 124 are formed respectively at different steps. In some embodiments, the formation of the openings 151 above the metal gate stacks 150 may be earlier than the formation of the opening 151 above the source/drain region 124. In some embodiments, the formation of the openings 151 above the metal gate stacks 150 may be latter than the formation of the opening 151 above the source/drain region 124.

Figure 11:
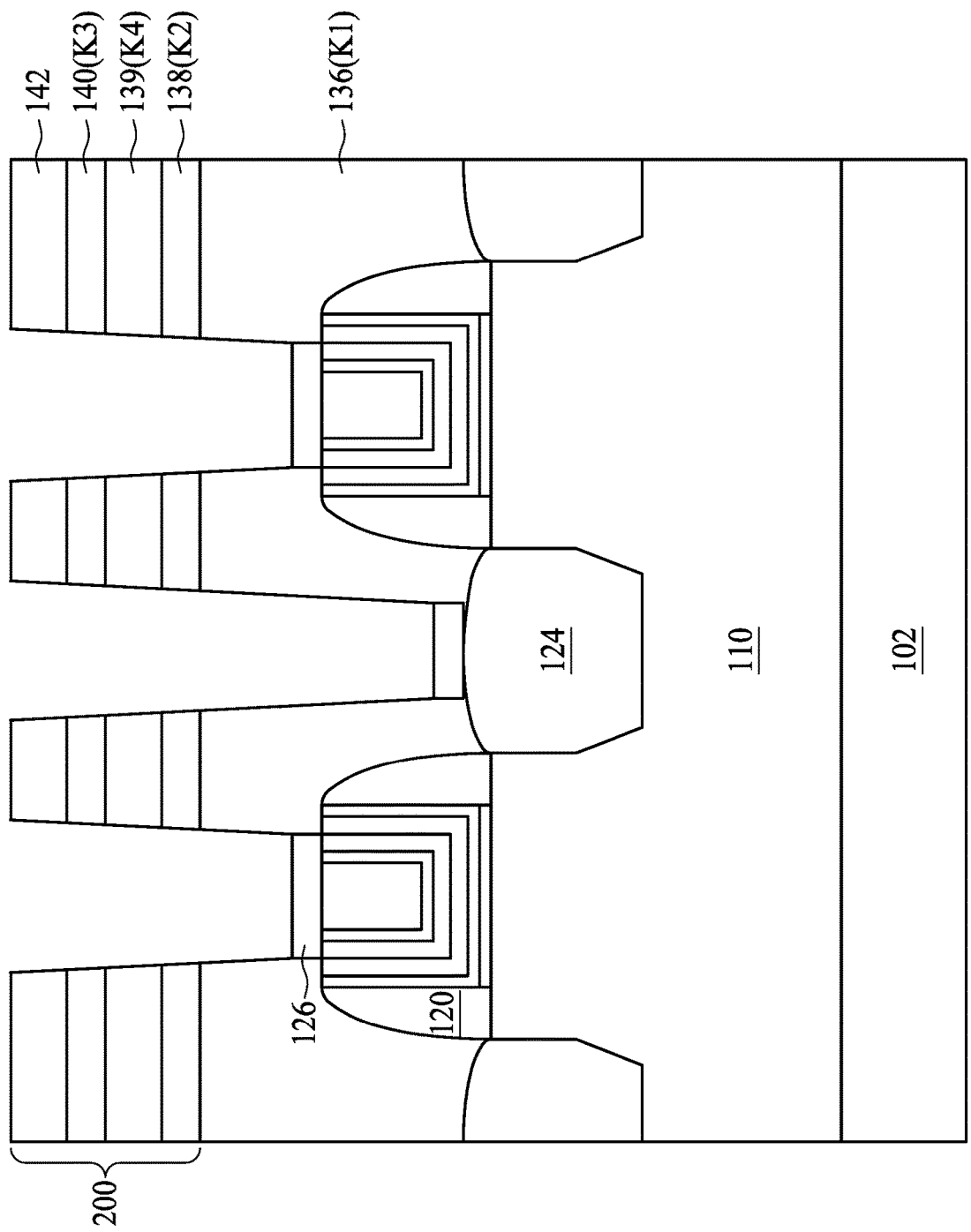

As shown in FIG. 11, a silicide layer 126 is formed on each of the exposed portions of the metal gate stacks 150 and the source/drain region 124. The silicide layer 126 may be deposited using a conformal deposition method such as ALD. The silicide layer 126 may include metal silicides, metal germanides, metal silicon germanides, titanium (Ti), nickel (Ni), cobalt (Co), or the like. In some embodiments, an annealing is performed using, for example, thermal soaking, spike annealing, flash annealing, laser annealing, or the like to form the silicide layer 126.

Figure 12:
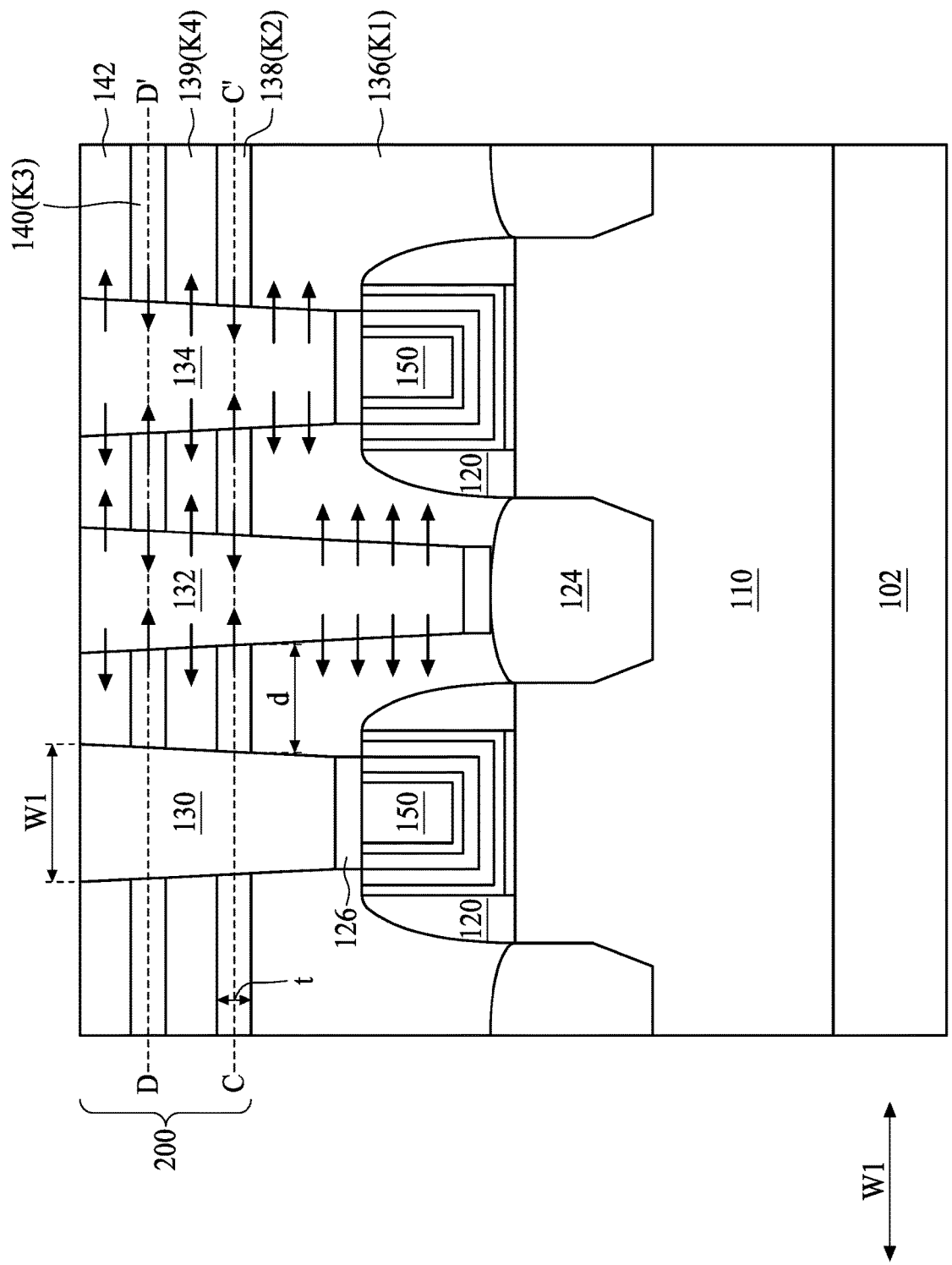

As shown in FIG. 12, the contact plugs 130, 132 and 134 are formed. In some embodiments, the contact plugs 130, 132 and 134 may be formed by filling the openings 151 with a conductive material. After the filling of the conductive material, a CMP may be performed to remove the excess portion of the conductive material, and the remaining conductive material in the openings 151 forms the contact plugs 130, 132 and 134. The conductive material of the contact plugs 130, 132 and 134 is in contact with the dielectric layer 136 and the layers in the multilayer structure 200.

In some embodiments, the contact plugs 130, 132 and 134 may include tungsten (W), aluminum (Al), copper (Cu), titanium nitride (TiN), tantalum nitride (TaN), or other metal(s) or metal alloys. The filling of the openings 151 may be performed using ALD. The precursor may include $WF_6$, for example.

Figure 13:
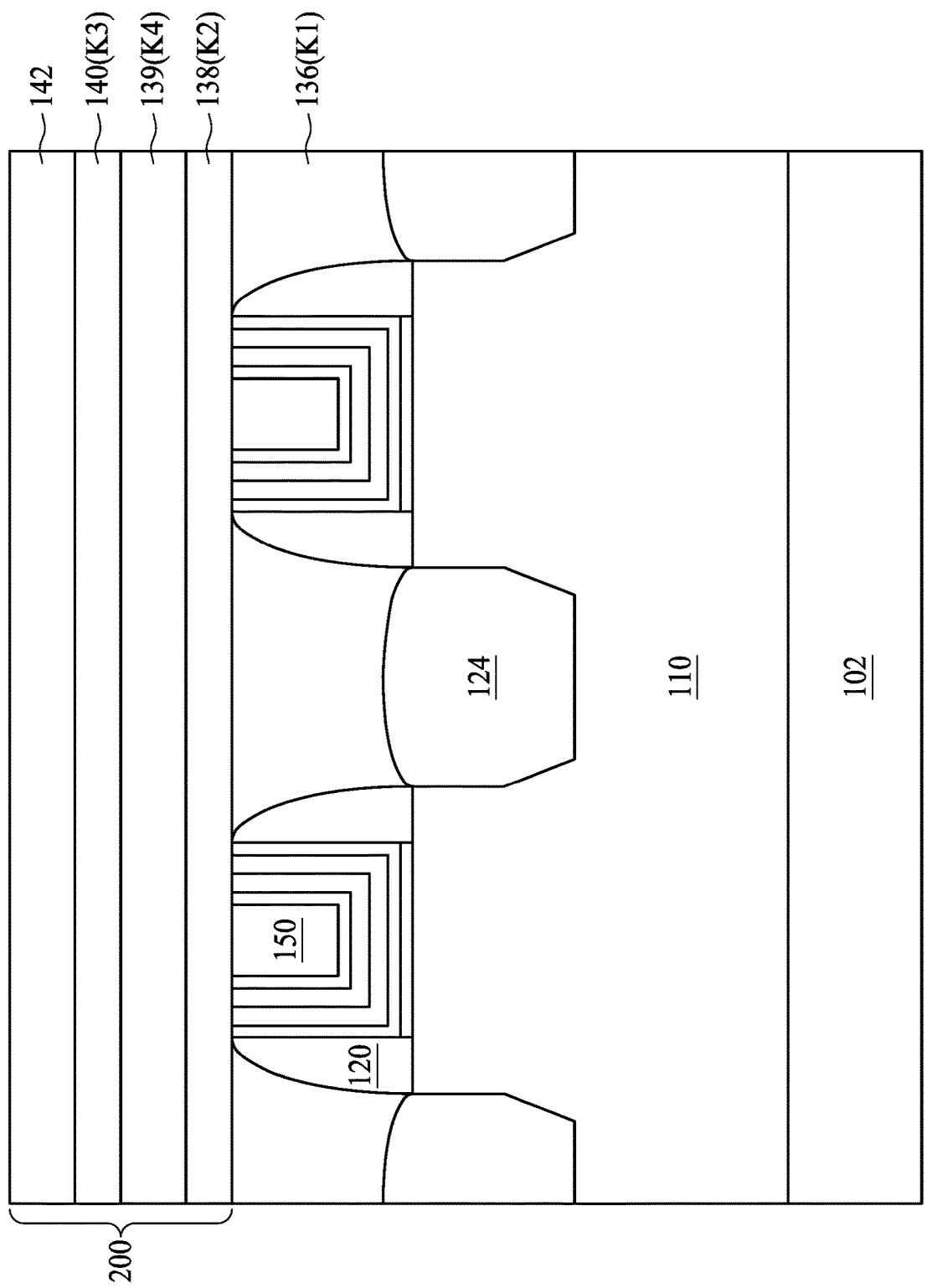
FIGS. 13 to 15 are perspective and cross-sectional views of a semiconductor structure at various stages of fabrication, in accordance with some embodiments of the present disclosure.
Figure 14:
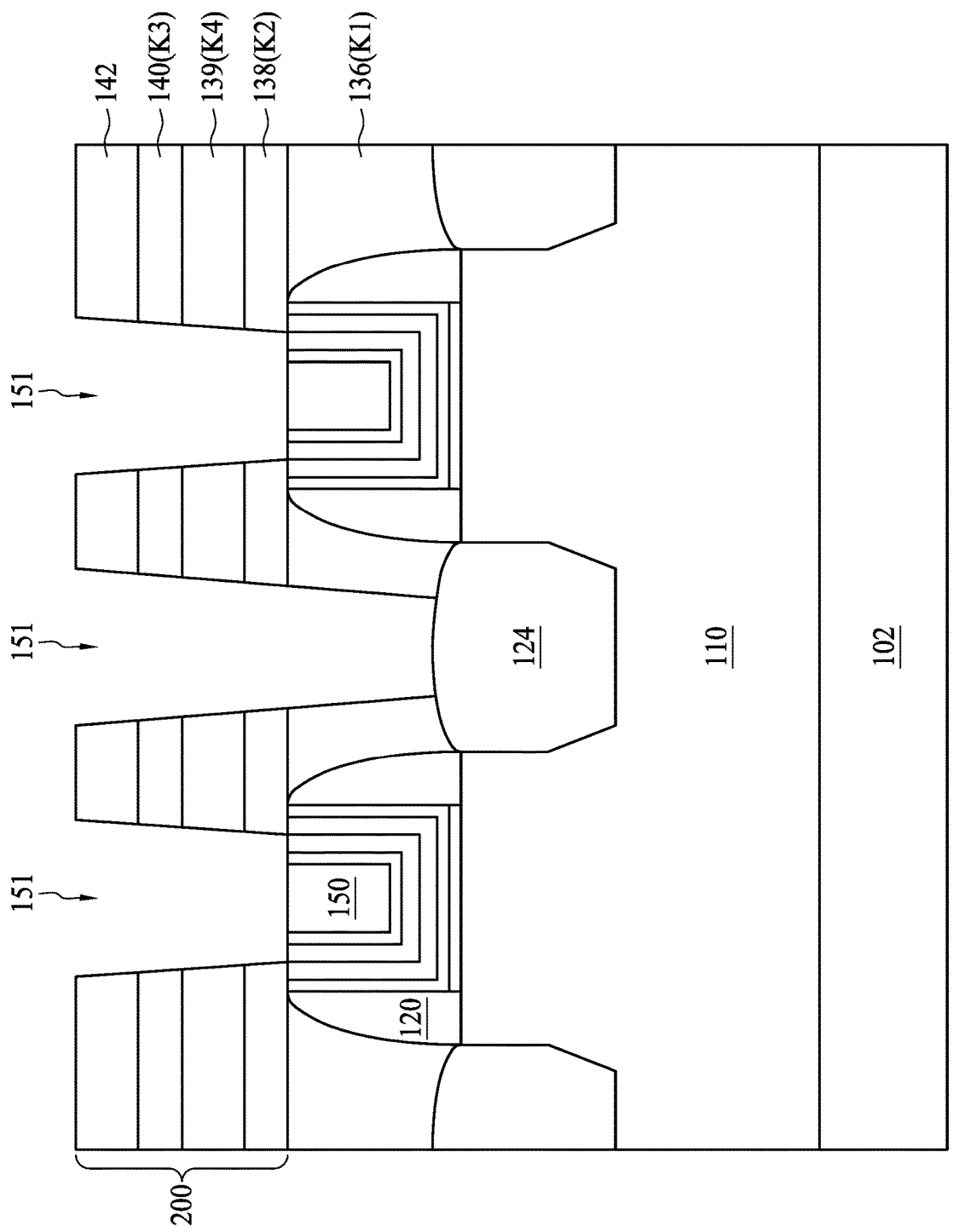
Figure 15:
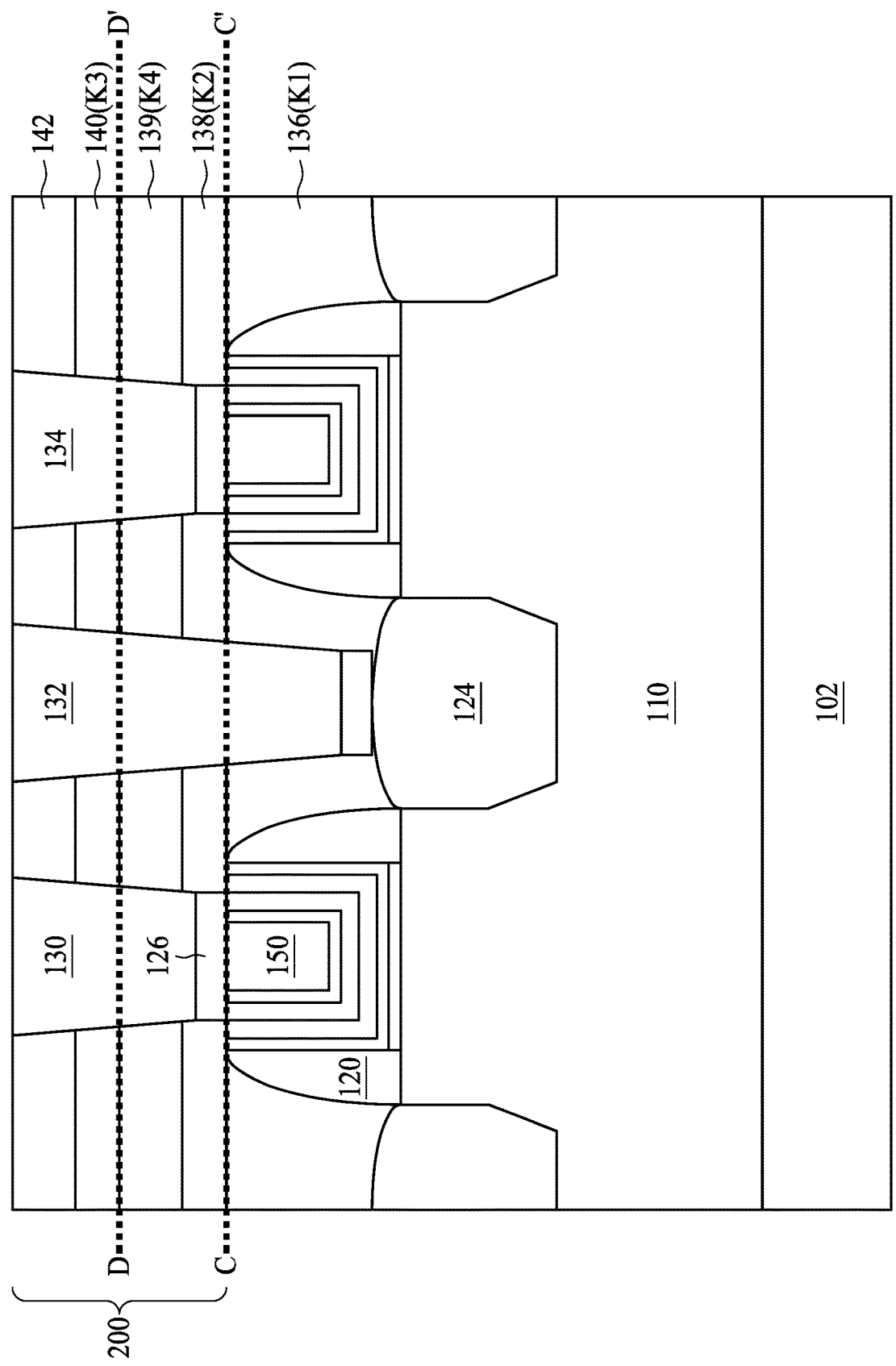

Referring to FIGS. 13 to 15, FIGS. 13 to 15 are perspective and cross-sectional views of a semiconductor structure at various stages of fabrication, in accordance with some embodiments of the present disclosure. The reference numerals in FIGS. 13 to 15 represent similar components in FIGS. 3 to 12 for simplicity of explanation.

The materials, dimensions, and the process steps for forming the semiconductive substrate 102, the fin 110, the source/drain regions 124, and the gate stack 150 may be essentially the same as the formation of the respective components described with reference to FIGS. 3 to 8, and such similar descriptions are omitted in the interest of brevity, and only the differences are provided.

As shown in FIG. 13, after the dummy gate stacks are removed and replaced with metal gate stacks 150 in FIG. 8, the multilayer structure 200 is formed to directly contact with the metal gate stacks 150. In some embodiments, the capping layer 138 is in contact with the metal gate stacks 150, the gate spacers 120, or the both. In some embodiments, the capping layer 138 and the gate spacers 120 have the same materials.

In FIG. 14, some portions of the dielectric layer 136 and the multilayer structure 200 are removed, thereby forming openings 151. In FIG. 15, the silicide layer 126 is formed on each of the exposed portions of the metal gate stacks 150 and the source/drain region 124. Then, the contact plugs 130, 132 and 134 are formed. With the multilayer structure 200 formed to be in contact with the metal gate stacks 150, the contact plugs 130, 132 and 134 are more rigid and stable in comparison with the embodiments that the multilayer structure 200 are separated with the metal gate stacks 150 in FIG. 12.

Figure 16B:
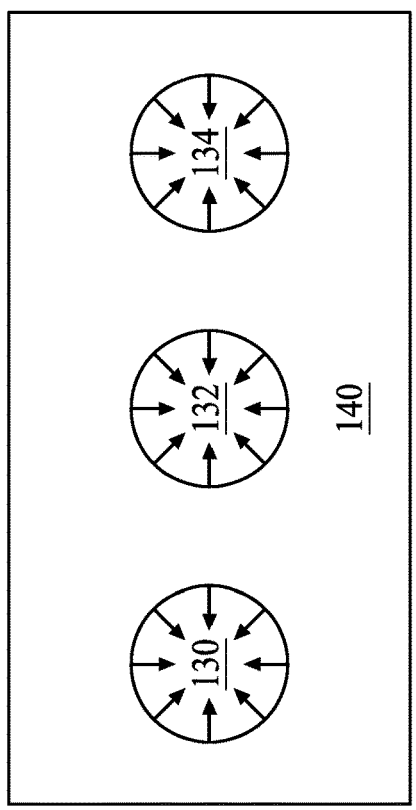
FIGS. 16A and 16B are top views of contact plugs encircled by capping layers, in accordance with some embodiments of the present disclosure.
Figure 16A:
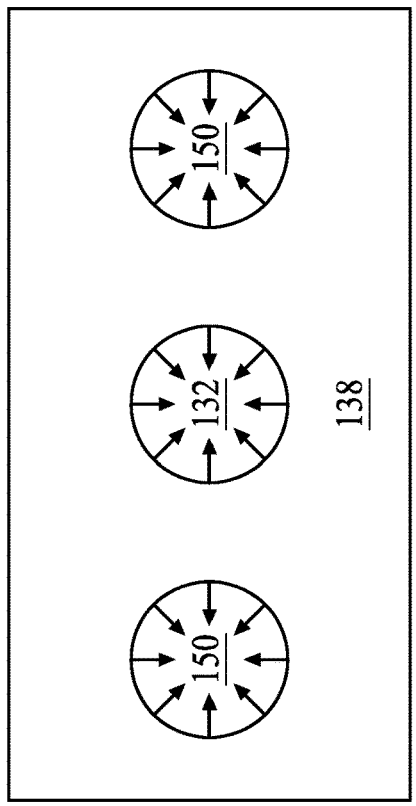

Referring to FIGS. 16A and 16B, FIGS. 16A and 16B are top views of contact plugs encircled by capping layers, in accordance with some embodiments of the present disclosure. In some embodiments, FIGS. 16A and 16B are top views along lines CC' and DD' in FIG. 15. As shown in FIGS. 16A and 16B, each capping layer 138 or 140 is blanket formed over dielectric layer 136 or dielectric film 139. The contact plugs 130, 132 and 134 are inserted into the capping layer and also encircled by the capping layer. In some embodiments, the contact plugs 130, 132 and 134 are isolated from each other by the capping layers.

In some embodiments, the capping layers 138 and 140 are designed to provide compressive stress to the metal gate stack in order to counter the tensile stress provided from the dielectric layer 136. The net stress on the metal gate stack 150 can be reduced in order to minimize the impact on the critical dimension (CD) of the metal gate stack 150. Therefore, the area CD uniformity of the metal gate stack can be improved by introducing the capping layers 138 and 140.

Some embodiments of the present disclosure provide a semiconductor structure. The semiconductor structure includes a semiconductive substrate, and a first contact plug formed on the semiconductive substrate. The semiconductor structure further includes a dielectric layer encircling the first contact plug. The semiconductor structure further includes a multilayer structure deposited on the dielectric layer and encircling the first contact plug. The dielectric layer produces a tensile stress pulling the first contact plug outward along a width direction. The multilayer structure produces a compressive stress that compensates for the tensile stress caused by the dielectric layer.

Some embodiments of the present disclosure provide a method of forming a semiconductor structure. The method includes providing a semiconductive substrate, and depositing a dielectric layer on the semiconductive substrate. The method further includes depositing a multilayer structure on the dielectric layer. The method further includes forming a first contact plug encircled by the dielectric layer and the multilayer structure.

Some embodiments of the present disclosure provide a method of forming a semiconductor structure. The method includes forming a dielectric layer. The method further includes determining a critical dimension for a plurality of contact plugs. The method further includes depositing a multilayer structure on the dielectric layer according to the critical dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. A method of forming a semiconductor structure, comprising:
    providing a semiconductive substrate;
    depositing a first dielectric layer on the semiconductive substrate;
    depositing a multilayer structure on the first dielectric layer; and
    forming a first contact plug encircled by the first dielectric layer and the multilayer structure,
    wherein depositing a first dielectric layer over the semiconductive substrate comprises embedding a second dielectric layer into the first dielectric layer, wherein the second dielectric layer has a dielectric constant greater than that of the first dielectric layer.

2. The method of claim 1, wherein the first dielectric layer has a first dielectric constant (K1); and wherein depositing a multilayer structure further comprises:
    forming a first capping layer having a second dielectric constant (K2) greater than the first dielectric constant (K1).

3. The method of claim 1, wherein the multilayer structure comprises alternating oxide layers and nitride layers.

4. The method of claim 1, wherein depositing a first dielectric layer comprises:
coating an oxide on the semiconductive substrate.

5. The method of claim 1, wherein the semiconductive substrate comprises a fin and a gate stack over the fin, wherein the first dielectric layer is formed over the gate stack and the fin, and the fin has a source/drain region.

6. A method of forming a semiconductor structure, comprising:
forming a first dielectric layer;
determining a critical dimension for a plurality of contact plugs; and
depositing a multilayer structure on the first dielectric layer according to the critical dimension,
wherein depositing a multilayer structure comprises depositing a first capping layer, a second dielectric layer and a second capping layer over one another above the first dielectric layer, wherein the second dielectric layer is configured to generate tensile stress on the contact plugs and the first capping layer and the second capping layer are configured to generate compressive stress on the contact plugs.

7. The method of claim 6, wherein the critical dimension comprises a width of one of the plurality of contact plugs, or a distance between two of the plurality of contact plugs.

8. The method of claim 6, wherein depositing a multilayer structure comprises:
determining at least one of a thickness, a material and a number of layers of the multilayer structure according to the critical dimension.

9. The method of claim 6, wherein forming a first dielectric layer comprises:
coating an oxide on a semiconductive substrate.

10. The method of claim 6, further comprising:
providing a semiconductive substrate with a fin and a gate stack over the fin, wherein the first dielectric layer is formed over the gate stack and the fin, and the fin has a source/drain region.

11. The method of claim 10, further comprising:
removing a portion of the first dielectric layer to expose a portion of the gate stack.

12. The method of claim 6, further comprising:
forming the plurality of contact plugs through the first dielectric layer and the multilayer structure.

13. A method of forming a semiconductor structure, comprising:
forming semiconductor substrate comprising a first gate stack;
depositing a first dielectric layer over the first gate stack;
determining a critical dimension of a plurality of contact plugs;
determining a configuration of a multilayer structure, wherein the configuration comprises at least one of a number of layers and a material of the multilayer structure;
depositing the multilayer structure over the first dielectric layer according to the configuration;
etching a plurality of recesses through the multilayer structure according to the critical dimension; and
forming the plurality of contact plugs in the plurality of recesses,
wherein depositing the multilayer structure comprises depositing a first capping layer, a second dielectric layer and a second capping layer over one another above the first dielectric layer, wherein the second dielectric layer is configured to generate tensile stress on the contact plugs and the first capping layer and the second capping layer are configured to generate compressive stress on the contact plugs.

14. The method of claim 13, wherein the critical dimension comprises at least one of a width and a surface area of one of the plurality of recesses.

15. The method of claim 13, wherein the configuration of the multilayer structure is determined such that the multilayer structure generates a first stress on the contact plugs in a first direction opposite to a second direction of a second stress generated by the first dielectric layer.

16. The method of claim 13, wherein the second dielectric layer has a dielectric constant less than that of the first capping layer and that of the second capping layer.

17. The method of claim 13, wherein the first capping layer has a density greater than that of the first dielectric layer.

18. The method of claim 13, wherein depositing the multilayer structure comprises depositing a third dielectric layer over the second capping layer, the third dielectric layer configured to generate tensile stress on the contact plugs.

19. The method of claim 13, wherein depositing a first dielectric layer over the first gate stack comprises embedding a fourth dielectric layer into the first dielectric layer, wherein the fourth dielectric layer has a dielectric constant greater than that of the first dielectric layer.

20. The method of claim 13, further comprising removing the first gate stack and forming a second gate stack in place of the first gate stack, wherein the multilayer structure is deposited over the second gate stack.

* * * * *